United States Patent
Ho

(10) Patent No.: US 7,581,960 B2
(45) Date of Patent: Sep. 1, 2009

(54) CAMERA MODULE AND ASSEMBLING PROCESS THEREOF

(75) Inventor: Chun-Tsai Ho, Taipei (TW)

(73) Assignee: Primax Electronics Ltd., Taipei (TW)

( * ) Notice: Subject to any disclaimer, the term of this patent is extended or adjusted under 35 U.S.C. 154(b) by 0 days.

(21) Appl. No.: 11/563,517

(22) Filed: Nov. 27, 2006

(65) Prior Publication Data

US 2008/0050943 A1      Feb. 28, 2008

(30) Foreign Application Priority Data

Aug. 25, 2006   (TW) ............................... 95131261 A

(51) Int. Cl.
*H05K 1/00* (2006.01)
(52) U.S. Cl. ....................................................... 439/68
(58) Field of Classification Search ................... 439/68, 439/59, 60; 257/432, 711, 778; 438/108, 438/118, 126; 348/340, E5.024
See application file for complete search history.

(56) References Cited

U.S. PATENT DOCUMENTS

| | | | | |
|---|---|---|---|---|
| 6,313,533 | B1 * | 11/2001 | Funaya et al. | 257/737 |
| 6,396,116 | B1 * | 5/2002 | Kelly et al. | 257/432 |
| 7,276,400 | B2 * | 10/2007 | Fjelstad | 438/126 |

* cited by examiner

*Primary Examiner*—Alexander Gilman

(57) ABSTRACT

A camera module and an assembling process thereof are provided. The camera module includes a composite printed circuit board, an image sensing chip and an underfill. The composite printed circuit board includes a signal terminal to be connected with a conductive bump of the image sensing chip. The underfill is formed around a connecting region between the conductive bump and the signal terminal.

2 Claims, 4 Drawing Sheets

CAMERA MODULE AND ASSEMBLING PROCESS THEREOF

FIELD OF THE INVENTION

The present invention relates to a camera module and a process of assembling the camera module, and more particularly to a camera module and a process of assembling the camera module used in portable electronic devices such as mobile phones, personal digital assistants and the like.

BACKGROUND OF THE INVENTION

Please refer to FIGS. 1A, 1B and 1C. The steps of a process of assembling a camera module 1 according to prior art will be illustrated as follows.

First of all, as shown in FIG. 1A, a composite printed circuit board 11 and an image sensing chip 12 are provided. The composite printed circuit board 11 includes a first rigid printed circuit board 111, a second rigid printed circuit board 112 and a flexible printed circuit board 113, which is sandwiched between the first rigid printed circuit board 111 and the second rigid printed circuit board 112. A perforation 114 is formed in the composite printed circuit board 11. A signal terminal 111A is formed on a surface of the first rigid printed circuit board 111 of the composite printed circuit board 11. The image sensing chip 12 includes an image sensing region 121 and a contact pad 122, which is arranged outside the image sensing region 121 and corresponding to the signal terminal 111A. A conductive bump 13 is formed on the contact pad 122.

Next, as shown in FIG. 1B, the signal terminal 111A of the first rigid printed circuit board 111 and the conductive bump 13 of the image sensing chip 12 are aligned with each other, and then the image sensing chip 12 is laminated with the composite printed circuit board 11. Consequently, the image sensing chip 12 and the composite printed circuit board 11 are electrically connected to each other.

For isolating the image sensing chip 12 from the adverse environmental conditions such as humidity, dust and the like, an underfill 14 is formed on the periphery of the image sensing chip 12, as can be seen in FIG. 1C.

The process of assembling the camera module 1 as shown in FIGS. 1A, 1B and 1C is disclosed for example in Taiwanese Patent No. 543,925, and the contents of which are hereby incorporated by reference.

Please refer to FIG. 1C again. For preventing isolating the image sensing chip 12 from humidity or dust, it is necessary to reserve an operative area W1 on the composite printed circuit board 11 so as to apply the underfill 14. The extended length W of the composite printed circuit board 11 resulting from the operative area W1 is still adverse to minimization of the overall camera module 1.

In views of the above-described disadvantages resulted from the prior art, the applicant keeps on carving unflaggingly to develop a camera module and an assembling process thereof according to the present invention through wholehearted experience and research.

SUMMARY OF THE INVENTION

It is an object of the present invention to provide a camera module having reduced size by forming the underfill around a connecting region between the composite printed circuit board and the image sensing chip.

In accordance with an aspect of the present invention, there is provided a camera module. The camera module includes a composite printed circuit board, an image sensing chip and an underfill. The composite printed circuit board includes a first rigid printed circuit board, a second rigid printed circuit board and a flexible printed circuit board between the first rigid printed circuit board and the second rigid printed circuit board. A perforation is formed in the composite printed circuit board to penetrate through the first rigid printed circuit board, the flexible printed circuit board and the second rigid printed circuit board. A signal terminal is formed on the first rigid printed circuit board. The image sensing chip is arranged on the first rigid printed circuit board of the composite printed circuit board, and includes a conductive bump and an image sensing region. The conductive bump of the image sensing chip is connected with the signal terminal of the composite printed circuit board. The underfill is formed around a connecting region between the conductive bump and the signal terminal.

In an embodiment, the camera module further comprises a camera lens assembly arranged on the second rigid printed circuit board. The camera lens assembly includes a lens mount and a lens, so that a light focused by the camera lens assembly passes through the perforation of the composite printed circuit board to be imaged onto the image sensing region of the image sensing chip.

In accordance with another aspect of the present invention, there is provided a camera module. The camera module includes a composite printed circuit board, an image sensing chip and an underfill. The composite printed circuit board includes a first rigid printed circuit board, a second rigid printed circuit board and a flexible printed circuit board between the first rigid printed circuit board and the second rigid printed circuit board. A perforation is formed in the composite printed circuit board to penetrate through the first rigid printed circuit board, the flexible printed circuit board and the second rigid printed circuit board. A conductive bump is formed on the first rigid printed circuit board. The image sensing chip is arranged on the first rigid printed circuit board of the composite printed circuit board, and includes a contact pad and an image sensing region. The contact pad of the image sensing chip is connected with the conductive bump of the composite printed circuit board. The underfill is formed around a connecting region between the conductive bump and the contact pad.

In accordance with another aspect of the present invention, there is provided a process of assembling a camera module. Firstly, a composite printed circuit board is provided. The composite printed circuit board includes a first rigid printed circuit board, a second rigid printed circuit board and a flexible printed circuit board between the first rigid printed circuit board and the second rigid printed circuit board, wherein a signal terminal is formed on the first rigid printed circuit board. Then, an image sensing chip having a conductive bump is provided. Then, an underfill is applied around the signal terminal or the conductive bump. Afterwards, the image sensing chip is laminated with the composite printed circuit board such that the conductive bump is connected with the signal terminal.

In an embodiment, the process further comprises a step of fixing a camera lens assembly onto the second rigid printed circuit board, wherein the camera lens assembly includes a lens mount and a lens.

In accordance with another aspect of the present invention, there is provided a process of assembling a camera module. Firstly, a composite printed circuit board is provided. The composite printed circuit board includes a first rigid printed circuit board, a second rigid printed circuit board and a flexible printed circuit board between the first rigid printed circuit board and the second rigid printed circuit board, wherein a conductive bump is formed on the first rigid printed circuit board. Then, an image sensing chip having a contact pad is provided. Next, an underfill is applied around the contact pad or the conductive bump. Afterwards, the image sensing chip is laminated with the composite printed circuit board such that the contact pad is connected with the conductive bump.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Hereinafter, the steps of a process of assembling a camera module according to a preferred embodiment of the present invention will be illustrated with reference to FIGS. 2A, 2B, 2C and 2D.

Figure 1A:
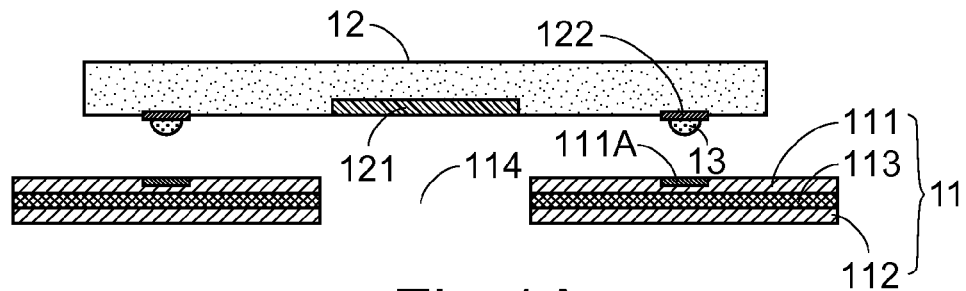
FIGS. 1A, 1B and 1C schematically illustrate the steps of a process of assembling a camera module according to prior art.
Figure 1B:
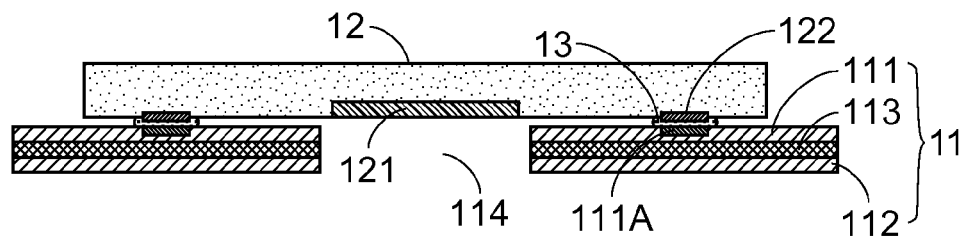
Figure 1C:
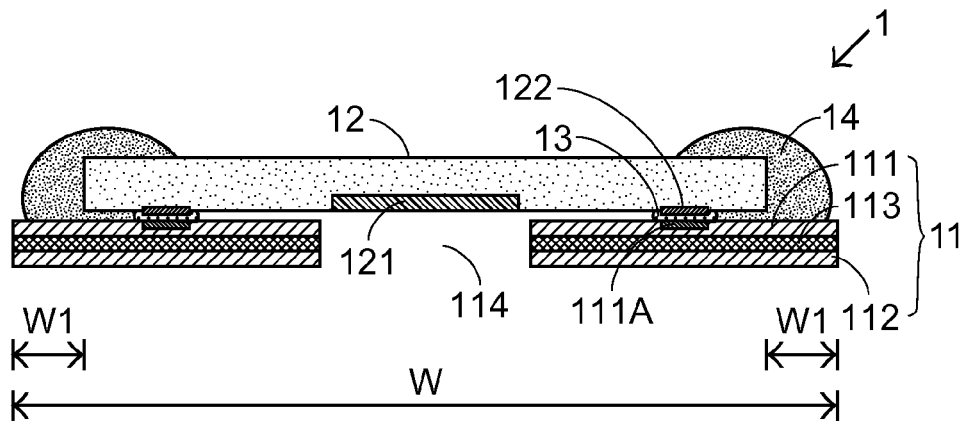
Figure 2A:
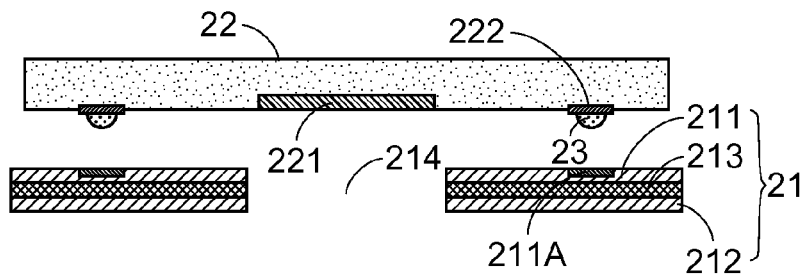
FIGS. 2A, 2B, 2C and 2D schematically illustrate the steps of a process of assembling a camera module according to a preferred embodiment of the present invention.

First of all, as shown in FIG. 2A, a composite printed circuit board 21 and an image sensing chip 22 are provided. The composite printed circuit board 21 includes a first rigid printed circuit board 211, a second rigid printed circuit board 212 and a flexible printed circuit board 213. The flexible printed circuit board 213 is sandwiched between the first rigid printed circuit board 211 and the second rigid printed circuit board 212. A perforation 214 is formed in the composite printed circuit board 21 to penetrate through the first rigid printed circuit board 211, the flexible printed circuit board 213 and the second rigid printed circuit board 212. A signal terminal 211A is formed on a surface of the first rigid printed circuit board 211 of the composite printed circuit board 21. The image sensing chip 22 includes an image sensing region 221 and a contact pad 222, which is arranged outside the image sensing region 221 and corresponding to the signal terminal 211A. A conductive bump 23 is formed on the contact pad 222.

Figure 2B:
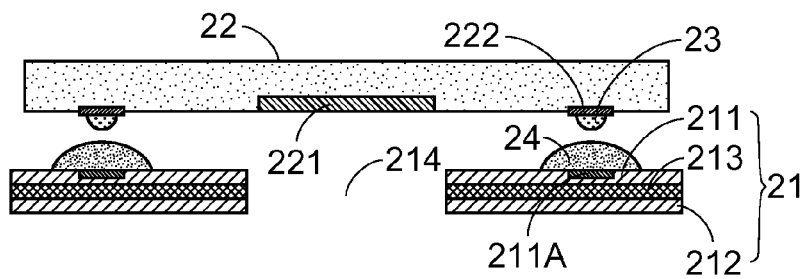
Figure 2C:
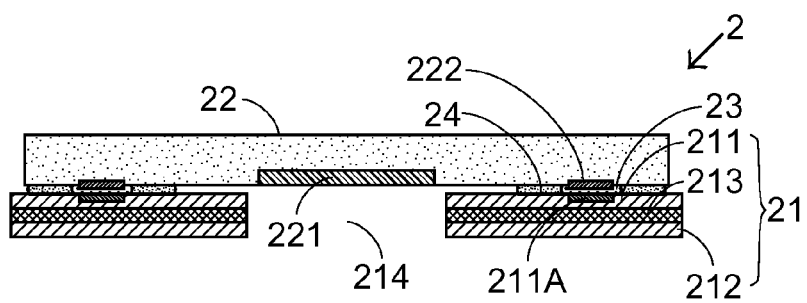
Figure 2D:
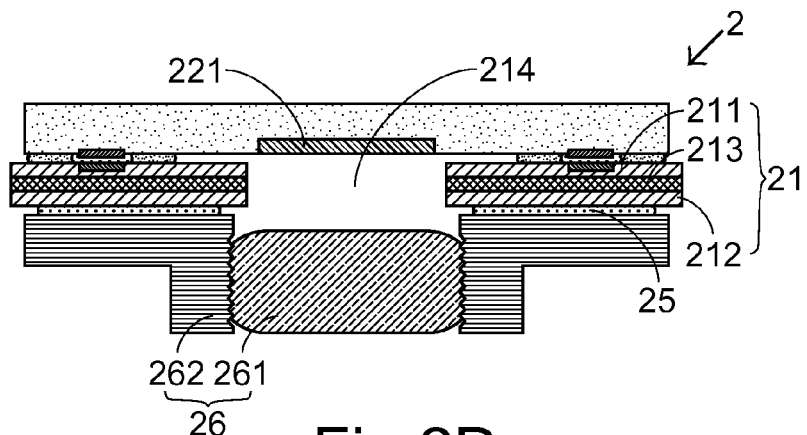

Next, as shown in FIGS. 2B and 2C, an underfill 24 is applied around the signal terminal 211A. The signal terminal 211A of the first rigid printed circuit board 211 and the conductive bump 23 of the image sensing chip 22 are aligned with each other, and then the image sensing chip 22 is laminated with the composite printed circuit board 21. Consequently, the image sensing chip 22 and the first rigid printed circuit board 211 of the composite printed circuit board 21 are electrically connected to each other. In comparison with the conventional process as described above, this embodiment is distinguished by firstly applying the underfill 24 around the signal terminal 211A and then filling the underfill 24 in the connecting region between the conductive bump 23 and the signal terminal 211A when the image sensing chip 22 is laminating onto the composite printed circuit board 21. Similarly, the underfill 24 is effective for isolating the image sensing chip 22 from the adverse environmental conditions such as humidity, dust and the like. Since the underfill 24 is applied around the signal terminal 211A, it is not necessary to reserve the operative area on the rims of the composite printed circuit board 21 for applying the underfill. As a consequence, the length or size of the composite printed circuit board 21 and the camera module 2 is reduced.

Then, a camera lens assembly 26, which includes a lens mount 261 and a lens 262, is provided. Via an adhesive, the camera lens assembly 26 is bonded onto the second rigid printed circuit board 212 so as to form a camera module 2 as shown of FIG. 2D. During operation, a light is focused by the camera lens assembly 26, and then the focused light passes through the perforation 214 of the composite printed circuit board 21 to be imaged onto the image sensing region 221 of the image sensing chip 22.

Figure 3A:
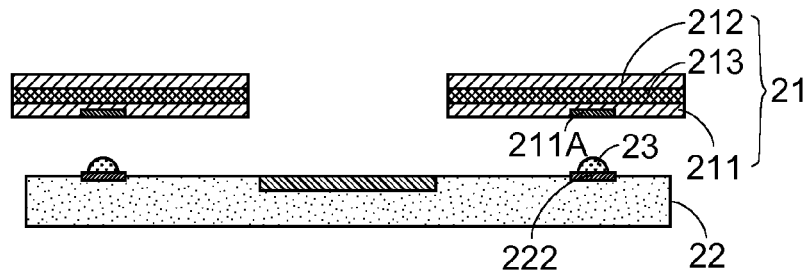
FIGS. 3A and 3B schematically illustrate the steps of a process of assembling a camera module according to another preferred embodiment of the present invention.
Figure 3B:
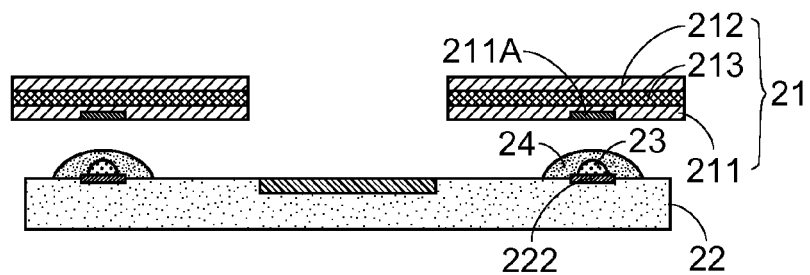

It is noted that, however, those skilled in the art will readily observe that numerous modifications and alterations of assembling the camera module may be made while retaining the teachings of the invention. For example, a further embodiment of a process of assembling the camera module is illustrated in FIGS. 3A and 3B. In FIG. 3A, a composite printed circuit board 21 and an image sensing chip 22 having the same configurations as shown in FIG. 2A are provided. Then, as shown in FIG. 3B, an underfill 24 is applied around the conductive bump 23 of the image sensing chip 22. Afterwards, the signal terminal 211A of the first rigid printed circuit board 211 and the conductive bump 23 of the image sensing chip 22 are aligned with each other, and then the composite printed circuit board 21 is laminated with the image sensing chip 22, thereby resulting in the camera module 2 as shown in FIG. 2C. As described in the embodiment of FIG. 2, the underfill 24 is firstly applied around the signal terminal 211A. Whereas, in the embodiment of FIG. 3, the underfill 24 is firstly applied around the conductive bump 23.

Figure 4A:
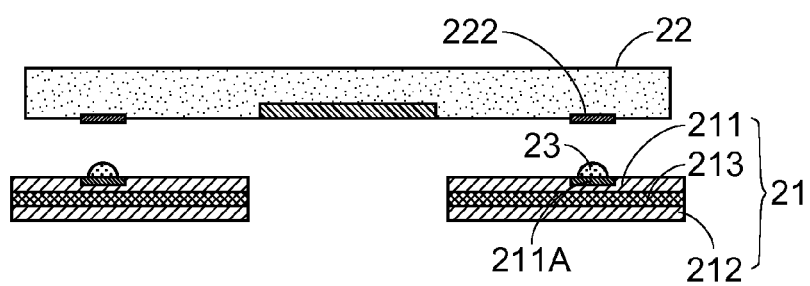
FIGS. 4A and 4B schematically illustrate the steps of a process of assembling a camera module according to a further preferred embodiment of the present invention.
Figure 4B:
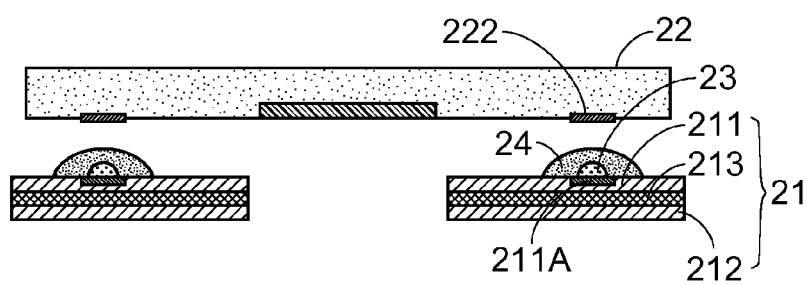

Alternatively, the location of the conductive bump 23 is varied. A further embodiment of a process of assembling the camera module is illustrated in FIGS. 4A and 4B. In FIG. 4A, a composite printed circuit board 21 and an image sensing chip 22 having substantially identical configurations as shown in FIG. 2A are provided except that the conductive bump 23 is formed on the signal terminal 211A of the first rigid printed circuit board 211. Then, as shown in FIG. 4B, an underfill 24 is applied around the conductive bump 23 of the image sensing chip 22. Afterwards, the image sensing chip 22 is laminated with the composite printed circuit board 21, thereby resulting in the camera module 2 as shown in FIG. 2C.

Figure 5A:
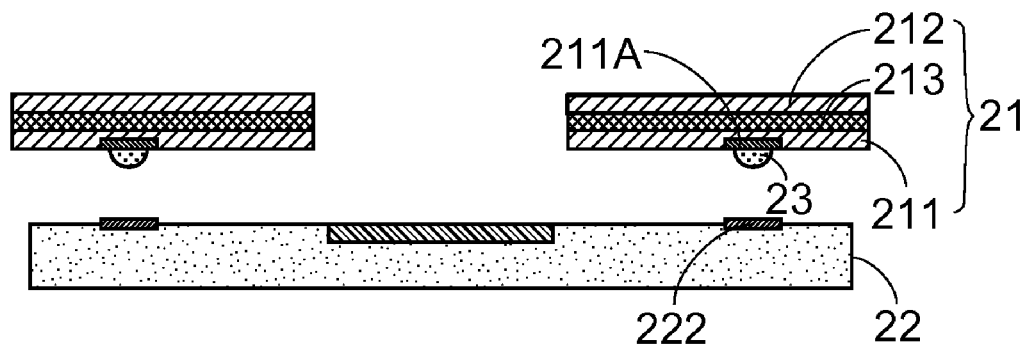
FIGS. 5A and 5B schematically illustrate the steps of a process of assembling a camera module according to a still another preferred embodiment of the present invention.
Figure 5B:
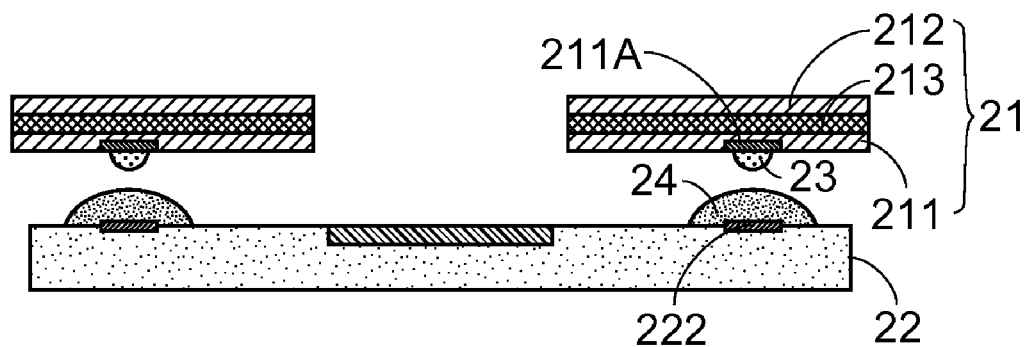

A further embodiment of a process of assembling the camera module is illustrated in FIGS. 5A and 5B. In FIG. 5A, a composite printed circuit board 21 and an image sensing chip 22 having the same configurations as shown in FIG. 4A are provided. Then, as shown in FIG. 5B, an underfill 24 is applied around the contact pad 222 of the image sensing chip 22. Afterwards, the composite printed circuit board 21 is laminated with the image sensing chip 22, thereby resulting in the camera module 2 as shown in FIG. 2C.

As previously described in the conventional process of assembling the camera module, the step of applying the underfill is prior to the laminating step and thus an operative area of the composite printed circuit board should be reserved. According to the present invention, since the underfill 24 is formed around the connecting region between the composite printed circuit board 21 and the image sensing chip 22 when the image sensing chip 22 is laminating onto the image sensing chip 22, it is not necessary to reserve the operative area on the rims of the composite printed circuit board 21 and the size of the camera module 2 is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process of assembling a camera module, comprising steps of:

providing a composite printed circuit board, said composite printed circuit board including a first rigid printed circuit board, a second rigid printed circuit board and a flexible printed circuit board between said first rigid printed circuit board and said second rigid printed circuit board, wherein a signal terminal is formed on said first rigid printed circuit board;

providing an image sensing chip having a conductive bump thereon;

applying an underfill covering said conductive bump;

laminating said image sensing chip with said composite printed circuit board such that said conductive bump is connected with said signal terminal, wherein the laminating is performed after the underfill is applied; and fixing a camera lens assembly onto said second rigid printed circuit board to make a focused light to be imaged onto said image sensing chip, wherein said camera lens assembly includes a lens mount and a lens.

2. A process of assembling a camera module, comprising steps of:

providing a composite printed circuit board, said composite printed circuit board including a first rigid printed circuit board, a second rigid printed circuit board and a flexible printed circuit board between said first rigid printed circuit board and said second rigid printed circuit board, wherein a conductive bump is formed on said first rigid printed circuit board;

providing an image sensing chip having a contact pad thereon;

applying an underfill covering said contact pad;

laminating said image sensing chip with said composite printed circuit board such that said contact pad is connected with said conductive bump, wherein the laminating is performed after the underfill is applied; and fixing a camera lens assembly onto said second rigid printed circuit board to make a focused light to be imaged onto said image sensing chip, wherein said camera lens assembly includes a lens mount and a lens.

* * * * *